US010396796B2

(12) United States Patent
Papadopoulos et al.

(10) Patent No.: US 10,396,796 B2
(45) Date of Patent: Aug. 27, 2019

(54) CIRCUIT, SYSTEM AND METHOD FOR THIN-FILM TRANSISTOR LOGIC GATES

(71) Applicants: Nikolaos Papadopoulos, Kitchener (CA); Manoj Sachdev, Waterloo (CA); William Wong, Waterloo (CA)

(72) Inventors: Nikolaos Papadopoulos, Kitchener (CA); Manoj Sachdev, Waterloo (CA); William Wong, Waterloo (CA)

(*) Notice: Subject to any disclaimer, the term of this patent is extended or adjusted under 35 U.S.C. 154(b) by 0 days.

(21) Appl. No.: 15/575,197

(22) PCT Filed: May 20, 2016

(86) PCT No.: PCT/CA2016/050572
§ 371 (c)(1),
(2) Date: Nov. 17, 2017

(87) PCT Pub. No.: WO2016/183687
PCT Pub. Date: Nov. 24, 2016

(65) Prior Publication Data
US 2018/0152189 A1 May 31, 2018

Related U.S. Application Data

(60) Provisional application No. 62/164,027, filed on May 20, 2015.

(51) Int. Cl.
*H03K 19/0944* (2006.01)
*H03K 19/094* (2006.01)
(Continued)

(52) U.S. Cl.
CPC ........... *H03K 19/0944* (2013.01); *G09G 3/20* (2013.01); *H01L 27/1222* (2013.01);
(Continued)

(58) Field of Classification Search
CPC ............ H03K 19/0944; H03K 19/094; H03K 17/6871; G09G 3/20; G09G 3/344;
(Continued)

(56) References Cited

PUBLICATIONS

T. Hwang et al., "Inverters Using Only N-Type Indium Gallium Zinc Oxide Thin Film Transistors for Flat Panel Display Applications", Japanese Journal of Applied Physics, vol. 50, pp. 03CB06, 2011 (Year: 2011).*

(Continued)

*Primary Examiner* — Mark Edwards
(74) *Attorney, Agent, or Firm* — Gowling WLG (Canada) LLP; Neil W. Henderson

(57) ABSTRACT

A unipolar inverter circuit for thin-film transistor circuits including: a driving voltage input; an input signal; a base voltage input; a first stage having a first inverter circuit connected between the driving voltage input and the base voltage input and driven by an input signal; a capacitor coupled to the output of the first stage at a node A; and a second stage having: a second inverter circuit having a second stage load transistor and a second stage driving transistor, wherein a gate of the load transistor is connected to the capacitor at a node B; and a clamping transistor connected between the driving voltage and the node B for controlling a voltage, wherein the clamping transistor gate is connected to the driving voltage input; and an output, wherein the capacitor enables charge injection to the gate of the second stage load transistor to allow approximately full voltage swing at the output based on the input signal.

20 Claims, 12 Drawing Sheets

(51) Int. Cl.
*G09G 3/20* (2006.01)
*H01L 27/12* (2006.01)
*H01L 29/786* (2006.01)
*H03K 17/687* (2006.01)
*G09G 3/34* (2006.01)
*H01L 29/24* (2006.01)

(52) U.S. Cl.
CPC ...... *H01L 27/1225* (2013.01); *H01L 27/1255* (2013.01); *H01L 29/7869* (2013.01); *H01L 29/78663* (2013.01); *H03K 17/6871* (2013.01); *H03K 19/094* (2013.01); *G09G 3/344* (2013.01); *G09G 2300/0408* (2013.01); *G09G 2310/0289* (2013.01); *G09G 2320/0214* (2013.01); *G09G 2320/04* (2013.01); *G09G 2330/021* (2013.01); *G09G 2330/023* (2013.01); *H01L 29/24* (2013.01)

(58) Field of Classification Search
CPC ... G09G 2300/0408; G09G 2310/0289; G09G 2320/0214; G09G 2320/04; G09G 2330/021; G09G 2330/023; H01L 27/1222; H01L 27/1225; H01L 27/1255; H01L 29/786; H01L 29/78663; H01L 29/7869; H01L 29/24
See application file for complete search history.

(56) References Cited

PUBLICATIONS

Anaxagoras et al. (eLeNA: a parametric CMOS active-pixel sensor for the evaluation of reset noise reduction architectures. IEEE Transactions on Electron Devices, (Sep. 2010) 57 (9). pp. 2163-2175, hereinafter "Anaxagoras") (Year: 2010).*

* cited by examiner ns with a limited number of pads or physical connections. Currently, flat panel display drivers tend to use CMOS or other similar, expensive technologies on a separate chip and extra contact pads, and connections are used to pass the required signals to the panel. This may be a problem for higher resolution displays due to lack of space and, for mobile applications, small size. Higher resolution means more pixels, which means smaller pixels, which means less space to make connections to external CMOS driving circuits and chips. In addition, the use of such external drivers can lead to extra power and energy consumption.

CIRCUIT, SYSTEM AND METHOD FOR THIN-FILM TRANSISTOR LOGIC GATES

CROSS REFERENCE TO RELATED APPLICATION

This application claims benefit of U.S. Provisional Patent Appln. No. 62/164,027 filed May 20, 2015, which is hereby incorporated herein by reference in its entirety.

FIELD

The present disclosure relates generally to logic gates for thin-film technology. More particularly, the present disclosure relates to a circuit, system and method for thin-film transistor logic gates providing approximately rail-to-rail output voltage swing and low leakage current.

BACKGROUND

Logic gates are important elements in many electronic devices, particularly those involving complex digital circuits. Transistors are the basic building blocks for implementation of logic gates and most, if not all, logic gates can be formed by beginning with an inverter circuit. Thin-film transistors are becoming a common tool in implementing logic gates, particularly in some technologies requiring smaller size such as, for example, thin-film displays, including electrophoretic displays, and the like.

There are generally two types of thin-film transistors (TFT) which are based on the underlying thin-film technology: p-channel devices are usually made from polymer/organic TFTs, and n-channel devices are usually made from, for example, hydrogenated amorphous silicon (a-Si:H) and transition-metal oxide (TMO) TFTs, such as, for example, InGaZnO (IGZO) TFTs. Polycrystalline silicon (poly-Si) TFTs are an exception in that poly-Si can be used to implement ambipolar transistors. However, in ambipolar transistors, performance non-uniformity can be a drawback due to grain boundary defects. Other drawbacks of ambipolar circuits may include high off currents so the switching action does not turn off completely and poor uniformity across large areas that may degrade image quality for large screens.

For the particular example of thin-film displays or panels, TFTs are key components in pixel circuits, digital signal processing and also in on-panel driving circuitry. For example, besides pixel circuits for driving the display media, TFTs are also used in level shifters, shift registers, line drivers, and other circuits.

Since complementary (i.e. ambipolar) transistors are difficult to provide when using TFTs, the design of an inverter with unipolar TFTs may require multiple inputs, and/or control signals in order to provide the desired operation. In particular, in attempts to provide rail-to-rail operation and decrease power dissipation, various inverter designs have been using dual gate devices or hybrid devices and complex fabrication processes but at the expense of cost, additional power consumption and yield.

These limitations can prevent full-swing digital circuits from being implemented for applications in emerging thin-film technologies such as flexible organic or transparent TMO electronics. In addition, even if a larger swing in voltage can be obtained, known circuits often have large direct path current which leads to substantial waste of power and energy.

In the case of thin film display panels, it is desirable to have capabilities of implementing analog and digital driving circuits fabricated on-panel due to the increased number of address/data lines in flat panel display and sensor array applications with a limited number of pads or physical connections. Currently, flat panel display drivers tend to use CMOS or other similar, expensive technologies on a separate chip and extra contact pads, and connections are used to pass the required signals to the panel. This may be a problem for higher resolution displays due to lack of space and, for mobile applications, small size. Higher resolution means more pixels, which means smaller pixels, which means less space to make connections to external CMOS driving circuits and chips. In addition, the use of such external drivers can lead to extra power and energy consumption.

Generally speaking, thin-film transistor (TFT) technology is relatively inexpensive to manufacture, yet in typical implementations has only one type of transistor (n-type or p-type). As a consequence, circuit implementations tend to have reduced output swings, high direct path current and power dissipation issues.

As such, there is a need for improved implementations of unipolar transistor logic gates, including inverter circuits, that address at least some of the deficiencies of conventional unipolar logic gates and inverter circuits.

SUMMARY

In a first aspect, there is provided a unipolar inverter circuit for thin-film transistor circuits including: a driving voltage input; an input signal input; a base voltage input; a first stage having: a first unipolar inverter circuit connected between the driving voltage input and the base voltage input and driven by an input signal received by the input signal input; a capacitor coupled to the output of the first stage at a node A; and a second stage having: a second unipolar inverter circuit connected between the driving voltage input and the base voltage input, wherein the second unipolar inverter circuit comprises a second stage load transistor and a second stage driving transistor, wherein a gate of the load transistor is connected to the capacitor at a node B rather than to the driving voltage input; and a clamping transistor connected between the driving voltage and the node B for controlling a voltage across the capacitor, wherein the clamping transistor gate is connected to the driving voltage; and an output provided between the second stage load transistor and the second stage driving transistor, wherein the capacitor enables charge injection to the gate of the second stage load transistor to allow approximately full voltage swing of the output voltage at the output based on the input signal.

In a particular case, the first stage of the inverter circuit may include: a first stage driving transistor connected to the base voltage input; and a first stage load transistor connected to the first transistor and the driving voltage input, wherein the first stage driving transistor gate is connected to the input signal input and the first stage load transistor gate is connected to the driving voltage and the capacitor is connect to the node A between the first stage driving transistor and the first stage load transistor.

In another particular case, the inverter circuit may include a switchable feedback unit configured to pull down a gate voltage of the first stage load transistor and the second stage load transistor when the input signal input is low.

In yet another particular case, the switchable feedback unit may include: a first feedback transistor provided with a source and gate connected to the node B connecting the capacitor and the secondary load transistor and a drain connected to a node C connected to the gate of the second stage load transistor; and a second feedback transistor provided with a source connected to the node C, a gate connected to the input signal input and a drain connected to the base voltage input, In still another particular case, a gate of the first stage load transistor may be connected to the node C instead of the driving voltage input.

In yet another particular case, the driving voltage input may be the only voltage input.

In a particular case, the input signal input may be the only input signal input.

In another particular case, the transistors may be a-Si:H thin-film transistors.

In still another particular case, the transistors may be transition-metal oxide transistors.

In yet another particular case, the transistors may be InGaZnO transistors.

In another aspect, there is provided a logic gate include the inverter circuit.

In still another aspect, there is provided an electric circuit including the inverter circuit.

In yet another aspect, there is provided a thin-film transistor (TFT) display including the inverter circuit.

In still yet another aspect, there is provided a unipolar TFT inverter system including: a unipolar two transistor inverter connected between a driving voltage and a base voltage; means for boosting an output voltage of the inverter when an input signal is low; and means for reducing a gate voltage of a load transistor of the inverter when the input signal is high.

In a particular case, the unipolar TFT inverter system may include a feedback means for reducing power consumption when the input signal is high.

In another particular case, the means for boosting may not require an additional voltage input.

In still another particular case, the means for boosting may not require cross-connecting of transistors.

In yet another particular case, the means for boosting may include boosting a gate voltage at a load transistor of the unipolar two transistor inverter.

According to another aspect, there is provided a method of controlling a unipolar TFT inverter circuit, the method including: boosting an output voltage when an input signal is low; and reducing a gate voltage of a load transistor of the inverter when the input signal is high.

In a particular case, the method may include feedback of a voltage for reducing power consumption when the input signal is high.

In another particular case, the boosting may not require an additional voltage input.

Other aspects and features of the present disclosure will become apparent to those ordinarily skilled in the art upon review of the following description of specific embodiments in conjunction with the accompanying figures.

BRIEF DESCRIPTION OF THE FIGURES

Other aspects and features of the present disclosure will become apparent to those ordinarily skilled in the art upon review of the following description of specific embodiments in conjunction with the accompanying figures.

Embodiments of the present disclosure will now be described, by way of example only, with reference to the attached Figures.

DETAILED DESCRIPTION

The present disclosure generally describes embodiments of unipolar logic gates implemented using industry compatible n-channel or p-channel TFTs but providing substantially rail-to-rail output voltage swing (that is, an approximately full voltage swing from a base voltage level (such as ground) to input voltage based on an input signal) and improved power dissipation characteristics (such as, reduced direct path current). The embodiments deal primarily with a unipolar inverter logic gate but can also be extended to additional logic gates and circuits based on the inverter logic gate. In the embodiments provided herein, the circuits are provided with an input signal, a power supply (drive voltage), and a base voltage (in some cases, ground), without the need for other power supplies or input signals, which differs significantly from conventional designs.

The embodiments herein are intended to be implemented in various technologies, such as, for example, digital displays, flat panel displays, sensor arrays and the like, where usually only one type of TFT transistor is available (i.e. unipolar technologies). One application of the technology is in memory in pixel circuits, which allows for stored images that do not need to be refreshed with every frame scan, resulting in energy savings. It is also intended that the circuits and embodiments can be implemented without using complex fabrication processes and can be implemented within a conventional thin-film micro-fabrication process.

Figure 1A:
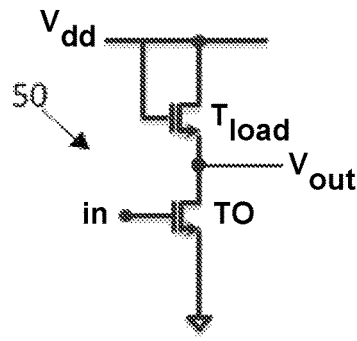
FIG. 1A illustrates a conventional TFT inverter circuit.
Figure 1B:
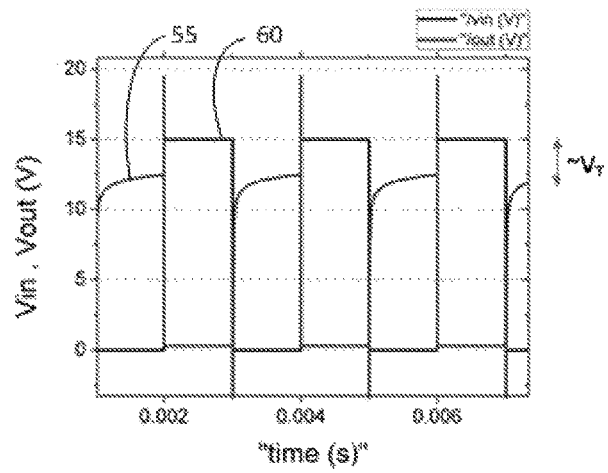
FIG. 1B illustrates a transient simulation for the circuit of FIG. 1A.

FIG. 1A depicts a conventional inverter 50 realized using two n-type TFTs, $T_{load}$ and $T_0$. As can be seen in the transient simulation illustrated in FIG. 1B, the output voltage $V_{out}$ (55) is unable to reach full swing (i.e. is unable to reach 15V when the input signal voltage is low (in =0V)). The inverter is unable to reach the full swing due to the threshold voltage drop, $V_T$, of the $T_{load}$ TFT. In other words, the output voltage is clamped or capped at $V_{dd}-V_T$. In this embodiment, since the transistor $T_{load}$ is always on, the transistor $T_{load}$ can also lead to a significant direct path current, and consequently increased power and current is used when the input signal (in) is high (60). More particularly, FIG. 1A illustrates that, when both transistors $T_{load}$ and $T_0$ are on, there is a direct path current from $V_{dd}$ to ground, which can lead to power dissipation.

Figure 2:
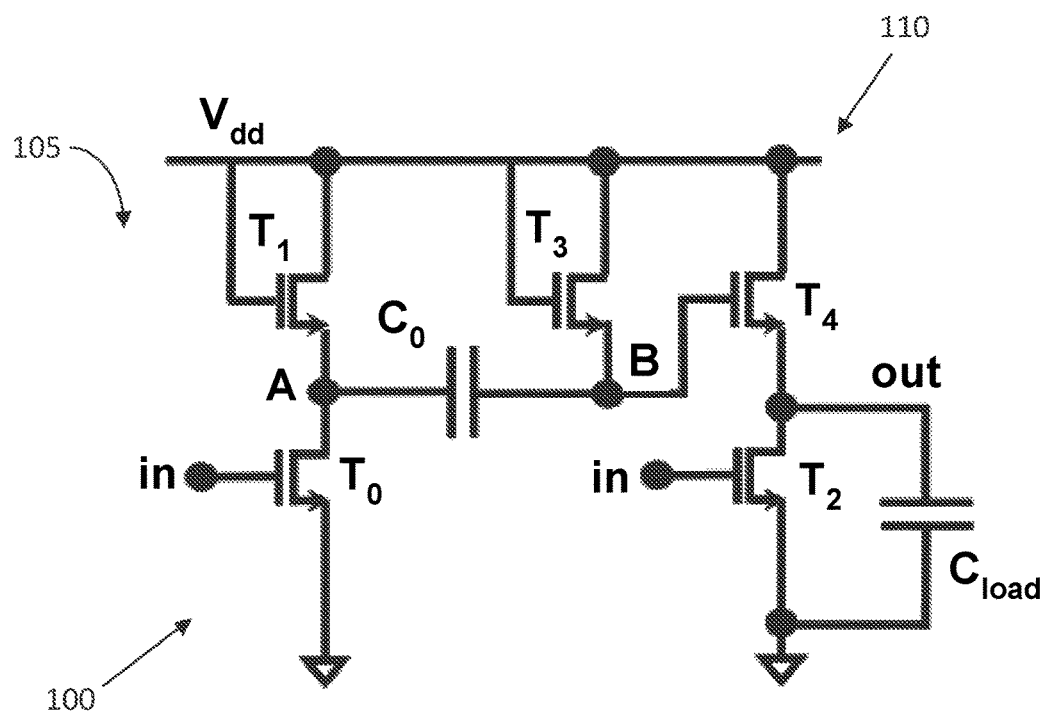
FIG. 2 illustrates a 5-TFT inverter circuit according to an embodiment.

FIG. 2 shows a schematic of an embodiment of a unipolar inverter circuit 100 (in this case, using n-channel type transistors but could also be implemented using p-channel type transistors), sometimes referred to herein as a 5-TFT circuit, that is intended to provide improved output swing of approximately rail-to-rail values. This circuit includes two stages, a first stage 105 and a second stage 110, which are connected by a capacitor $C_0$ and, in particular, are AC coupled by a capacitor $C_0$ when an input pulse signal (in) is low. The first stage includes transistors $T_0$ (a driving transistor) and $T_1$ (a load transistor) arranged similar to a conventional inverter such as that of FIG. 1A, with the capacitor $C_0$ connected at a node A between the two transistors $T_0$ and $T_1$. The second stage includes transistors $T_2$ and $T_4$ also arranged as a conventional inverter such as FIG. 1A but with the gate of $T_4$ connected to a node B rather than to $V_{dd}$. Node B is a connection point between the capacitor $C_0$ and a drain of a transistor $T_3$, which is source-gate connected to $V_{dd}$. In this circuit, when the input is low (in =0), a charge feedthrough from $C_0$ boosts the gate voltage of TFT $T_4$ driving the output of the inverter circuit (out) up to approximately $V_{dd}$. The gate voltage at TFT $T_4$ is intended to be boosted to a value larger than $V_{dd}+V_T$. When the input pulse signal (in) goes high, node A goes low, reducing the voltage on node B to close to $V_{dd}-V_T$. The low voltage at node A is determined by the relative strengths of $T_0$ and $T_1$ TFTs.

In FIG. 2, $T_4$ is acting as a load of $T_2$ (which is a driving transistor), but is driven with a voltage $V_{dd}-V_T$, when the input is high; which reduces the direct path current through T2 and T4, and acts to keep the $V_{out}$ at a low voltage. The output power dissipation is decreased in comparison to the typical pseudo-N-type inverter of FIG. 1A where load TFT $T_{load}$ is driven with a higher gate voltage equal to $V_{dd}$. $C_0$ forms a voltage divider with the total capacitance of internal node B. However, when the input signal (in) makes the 1->0 (high->low) transition, the node B goes to high voltage due to charge injection from the capacitor $C_0$. The voltage feedthrough injection can be approximated with the equation:

$$V_{inj}=C_0*(V_{AH}-V_{AL})/(C_0+C_B),\qquad(1)$$

where $C_B$ is the capacitance of node B excluding $C_0$, and $V_{AH}$ and $V_{AL}$ are the high and low voltage values of node A, when input goes low and high, respectively. $C_B$ is approximated to the sum of the "on" capacitance of transistor $T_4$, as well as the drain to gate overlap capacitance of $T_2$. Generally speaking, $T_4$ and $T_2$ should be as physically small as possible to provide higher $V_{inj}$ with a small $C_0$ in order to reduce the footprint of the inverter. Simultaneously, $T_4$ and $T_2$ should also be large enough to drive the output load for the required switching frequency.

For $V_{in}=V_{dd}$, the voltage ($V_A$) on node A can be calculated in order to optimize the low voltage on node A and the power dissipation of the circuits as follows:

$$V_A=(V_{dd}-V_T)(1-W_0/W_1+\text{sqrt}(W_0/W_1+1)^2-1)\qquad(2)$$

wherein $W_0$ and $W_1$ are the widths of the $T_0$ transistor and the $T_1$ transistor respectively. In the embodiments herein, a $V_A$ lower than the $V_T$ of the TFT is preferred in order to provide a higher value of $V_{inj}$.

Generally speaking, embodiments herein consist of multiple transistor stages coupled by a capacitor. This approach of using a capacitor is intended to take advantage of the capacitive coupling of the second (output) stage to the first (input) stage to pull up the output voltage ($V_{out}$) to approximately the level of the power supply ($V_{dd}$). The output voltage swing ($\Delta V_{out}$) of a conventional pseudo-N-type inverter (2-TFT) with one TFT gate-drain shorted to the $V_{dd}$ (as shown in FIG. 1A) is cropped at both high and low output voltages. At the high level the output is cropped at $V_{dd}-V_T$, while at the low level, since both T2 and T4 are on, the output is determined by relative strengths of these transistors. Generally, $T_2$ is configured to be stronger so that the output low is closer to the base voltage (in this case, ground) potential. Regardless of the relative strengths of $T_2$ and $T_4$, this can lead to increased direct path current and power dissipation when compared to the proposed circuit herein. The conventional approach can also result in slower output signals.

Figure 3A:
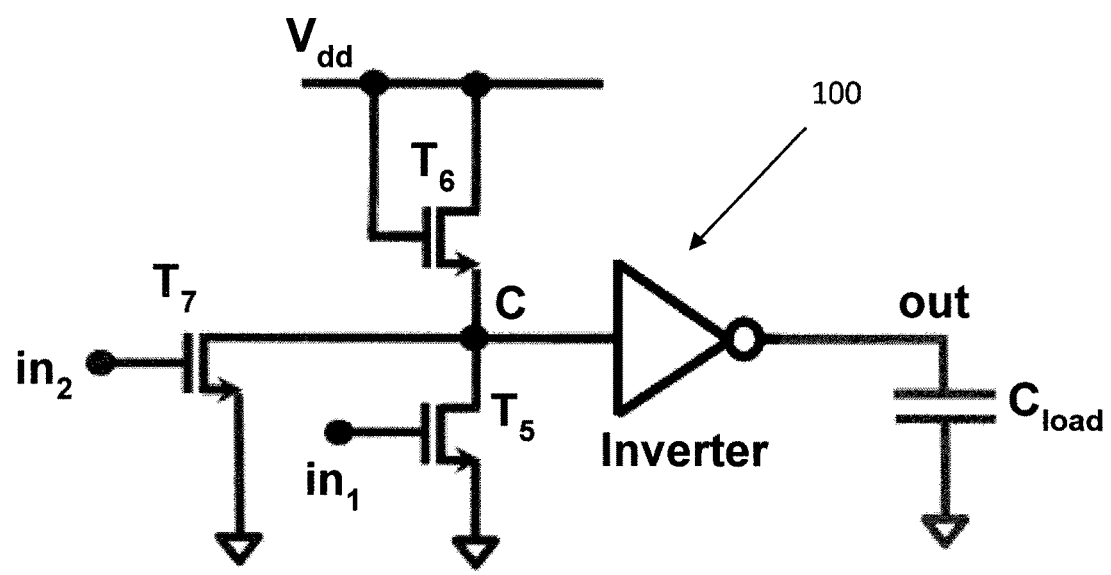
FIG. 3A illustrates an embodiment of an OR gate logic circuit implementation using the 5-TFT inverter of FIG. 2.
Figure 3C:
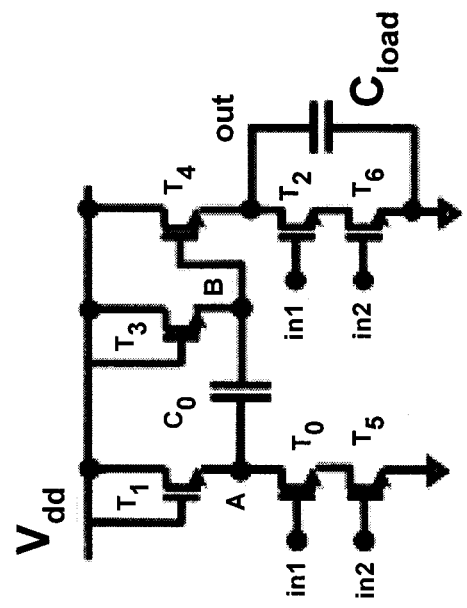
FIG. 3C illustrates an embodiment of a NAND gate logic circuit implementation using the 5-TFT inverter of FIG. 2.
Figure 3B:
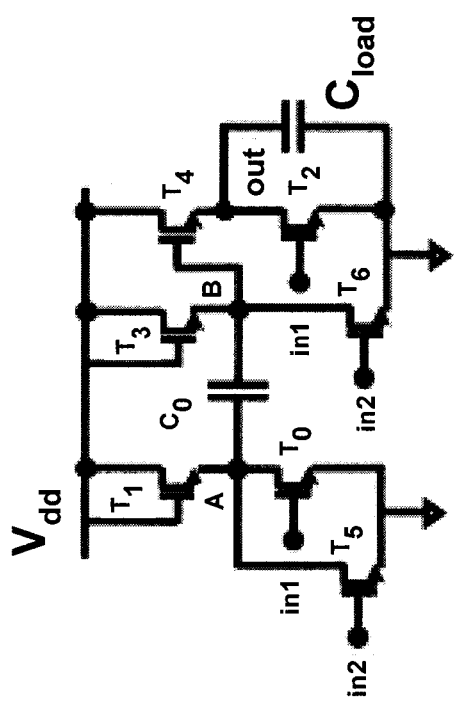
FIG. 3B illustrates an embodiment of a NOR gate logic circuit implementation using the 5-TFT inverter of FIG. 2.

Based on this circuit configuration of FIG. 2, the implementation of other types of logic gates is intended to be straightforward. For example, FIG. 3A illustrates an embodiment of an OR gate, using two input TFTs and a gate drain shorted TFT as a load on the same node C where the input of the inverter is connected. Similarly, an AND gate can be implemented. Additionally, as illustrated in FIG. 3B, a NOR gate can be implemented by adding in parallel TFTs to $T_0$ and $T_2$ to implement the second input. Similarly, as illustrated in FIG. 3C, a NAND gate can be implemented by adding extra TFTs in series to $T_0$ and $T_2$. It will be understood that NAND and NOR gates generally use fewer TFTs compared to OR and AND gates and are generally preferred.

In order to test the capability of embodiments of the circuit, system and method herein, the proposed circuits were simulated, and their performance was analyzed.

Figure 4:
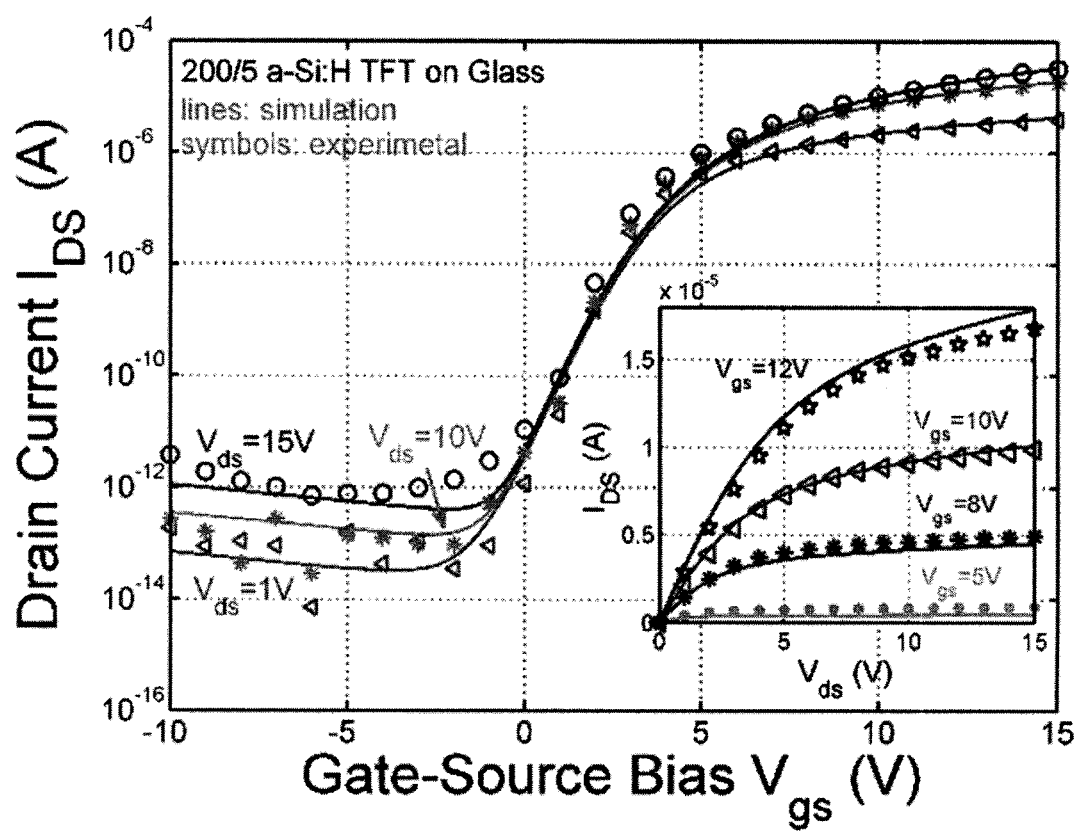
FIG. 4 illustrates the measured and simulated transfer and output characteristics for a W/L=200 µm/5 µm a-Si:H TFT for various $V_{gs}$ and $V_{ds}$ biases.

In FIG. 4, the measured transfer and output (inset in FIG. 4) characteristics of a-Si:H TFTs are shown in comparison to the simulated characteristics based on the Rensselaer Polytechnic Institute (RPI) a-Si TFT model. The fitting of the simulated to the measured data shows little deviation and was used for further simulations of the circuits. The tested a-Si:H TFTs have a linear mobility of $\mu=0.43\ c^{m2}/Vs$, $V_T=3.5V$, $I_{ON}/I_{OFF}$ ratio of $1^{07}$ and subthreshold slope of 0.534 V/dec.

Figure 5:
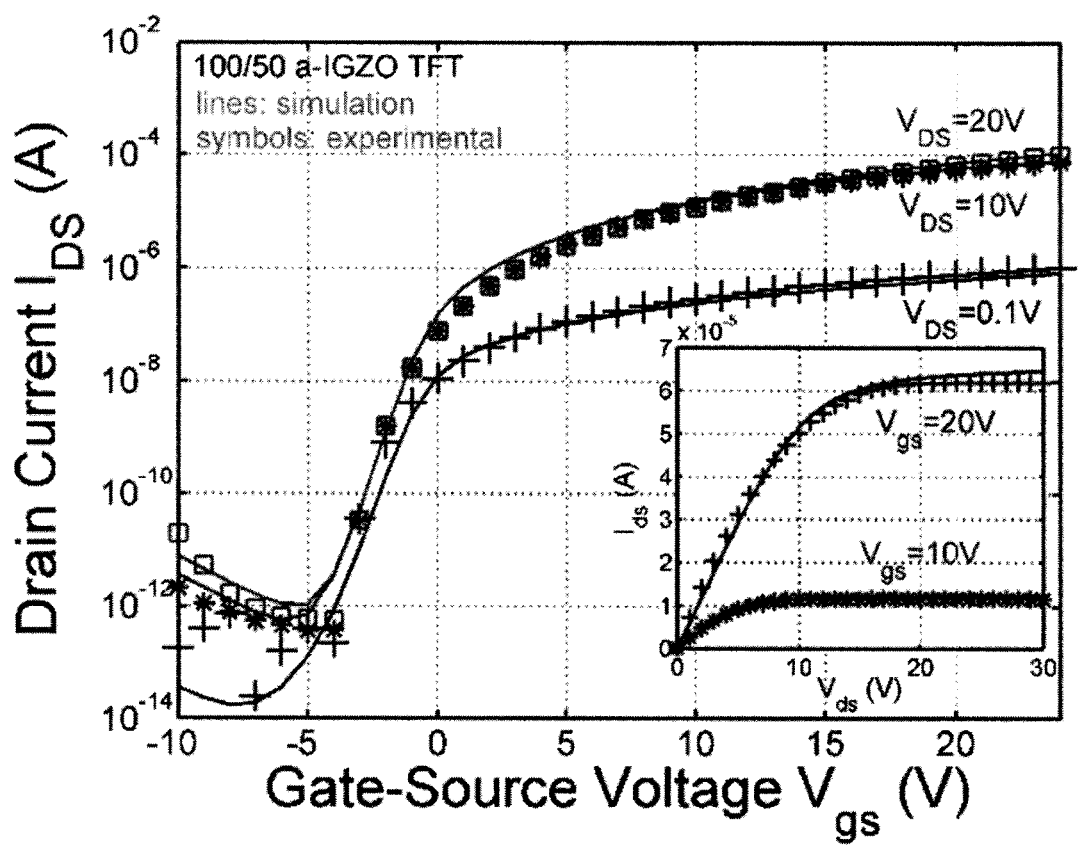
FIG. 5 illustrates the measured and simulated transfer characteristics and output for a W/L=100 µm/50 µm IGZO TFT for various $V_{gs}$ and $V_{ds}$ biases.

Embodiments were also analyzed and simulated using IGZO TFTs. In FIG. 5, measured transfer and output (inset in FIG. 5) characteristics in comparison to modeled data using the RPI a-Si TFT model are shown. The IGZO TFTs have a linear mobility of $\mu=7$ cm$^2$/Vs, $V_T=0.7$V, $I_{ON}/I_{OFF}$ ratio of $10^8$, and subthreshold slope of 0.561V/dec. The operation of the circuit designs has been demonstrated and discussed for the characteristic negative $V_{on}$ voltages of typical TMO TFT, $V_{on}=-4$V. In the IGZO case, the value $V_{on}$ can be considered somewhat similar to $V_T$ used in the discussion above.

Figure 6:
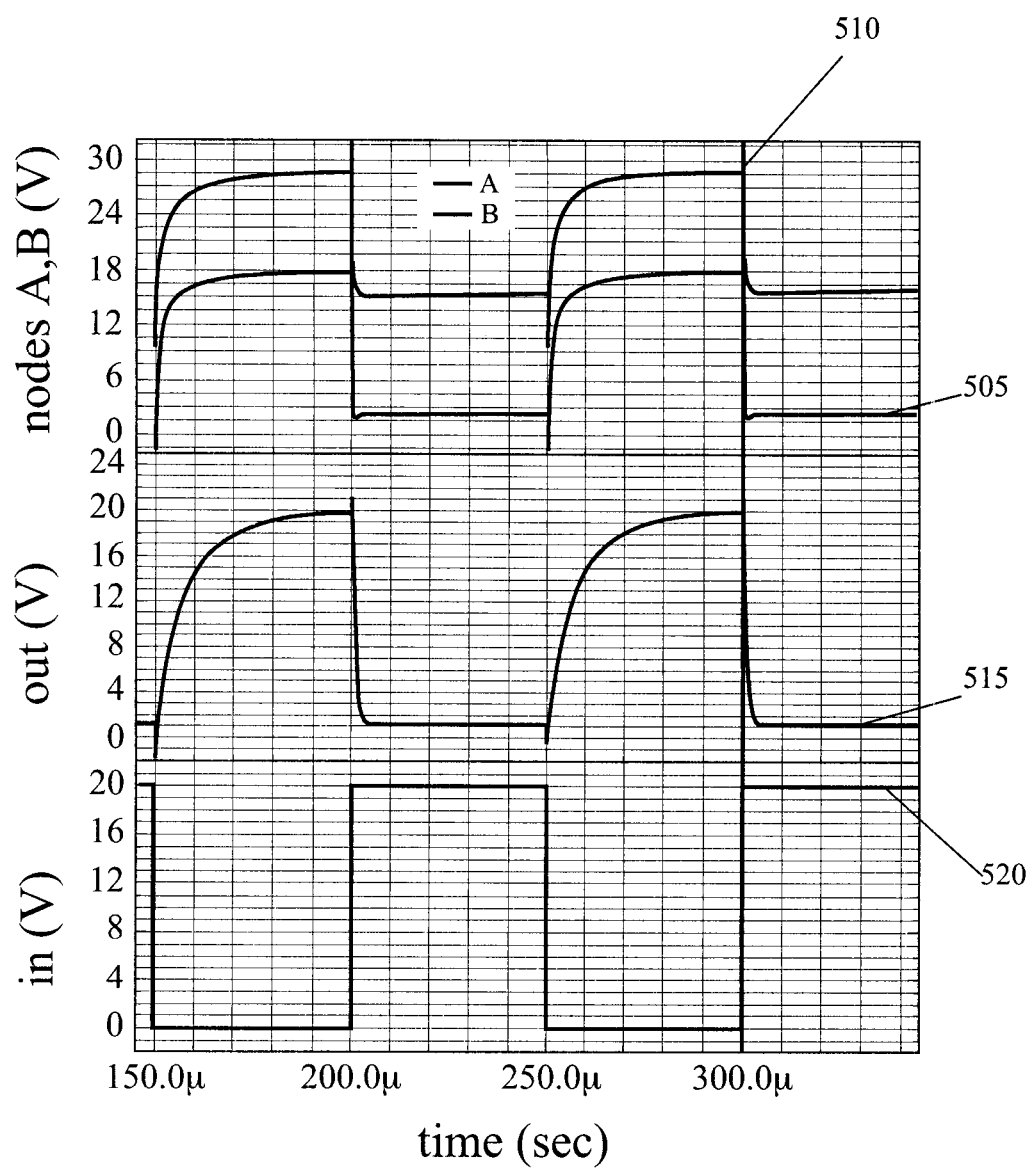
FIG. 6 illustrates simulated responses of nodes A, B and output of an embodiment of the 5-TFT inverter for a-Si:H TFT technology and $C_0$=500 fF and $C_{load}$=5 pF and for and input pulse of 10 kHz.

In FIG. 6, simulation results (505) of the voltage response at internal node A and simulation results (510) of the voltage response of internal node B of the inverter shown in FIG. 2 are shown for the modeled a-Si:H TFTs. For these simulations, the capacitor value is $C_0=0.5$ pF, which is five times larger than the on capacitance ($C_{T4}=\sim130$ fF) of $T_4$ (W/L=50 µm/5 µm). The width (W) of $T_2$ is five times larger than that of $T_4$ to decrease the low output voltage ($V_{out-LOW}$). In addition, the simulation of the output voltage response (515) of the inverter and the input signal (520) is shown in FIG. 6. The rise time of the output signal is $t_{rise}=17$ µs for a load of $C_{load}=5$ pF. The frequency of the input pulse is 10 kHz, the power supply is $V_{dd}=20$V.

Back channel etched (BCE) a-Si:H TFTs with an inverted-staggered bottom-gate were fabricated on 3" Corning 1737 glass substrates. The TFT process started with the deposition of a 70 nm Cr layer using DC sputtering followed by the pattern of the Cr layer for the bottom-gate metal. Next, a tri-layer of 350 nm hydrogenated silicon nitride (a-SiN:H) gate dielectric, 200 nm a-Si:H channel, and 50 nm highly p-dope (n$^+$) a-Si:H source/drain ohmic contact layers was consecutively deposited at 170° C. using plasma-enhanced chemical vapor deposition (PECVD). After patterning the TFT active area using dry etching, a 100 nm Cr source/drain contact was deposited using DC sputtering and then patterned to define the effective channel region. Next, PECVD deposition of a 350 nm a-SiN:H layer at 150° C. passivated the devices. A 500 nm Al contact was then deposited using DC sputtering and then patterned to form the final external metal contacts. The fabricated test wafers were then annealed in air at 150° C. for 2 hours before measurement.

Figure 7:
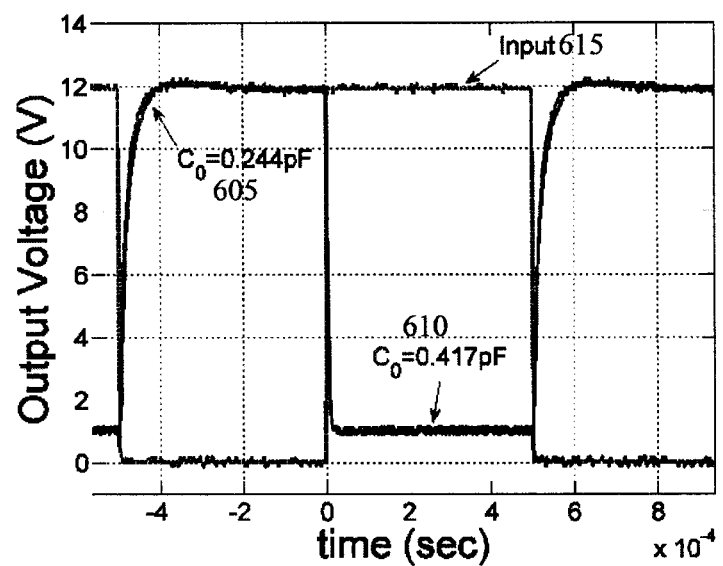
FIG. 7 illustrates measured responses of output of an embodiment of the a-Si:H 5TFT inverter for $C_0$=300 fF and 600 fF, for and input pulse of 1 kHz and $V_{dd}$=12V.

FIG. 7 shows a measurement result of the output voltage of the 5-TFT inverter design of FIG. 2 for an input pulse (615) of frequency f=1 kHz and $V_{dd}=12$V. The circuit sample under test consisted of five TFTs of channel length L=5 µm and an internal capacitor $C_0$ of 0.244 pF (605) and 0.417 pF (610). Note that the load on the output of the tested circuit sample is higher than that of the simulation results of FIG. 6 and of the order of tens of pF due to the measurement setup used in this example.

As shown in FIG. 7, the output is pulled up ('high') to $V_{dd}=12$ V. The output pull down value ($V_{out-LOW}=\sim1$ V) is lower than the $V_T$ of the TFT, as was designed using equation 2. In FIG. 7, the response of the output for the larger capacitor $C_0=0.417$ pF (610) is faster ($t_{rise}=43.2$ µs) than the one for the smaller capacitor (605) ($t_{rise}=52$ µs), as suggested from theory and equation 1. Delay times are $t_{delay}=11$ µs for the inverter circuit with the larger capacitor and 14.4 µs for the smaller capacitor. The transistor sizing of the devices of the inverter circuit sample under test of FIG. 7 is shown in TABLE I.

TABLE 1

Sizing of the 5-TFT Inverter of the results of FIG. 7

| TFT | W (µm) | L (µm) | parameter | value |
|---|---|---|---|---|
| $T_0$ | 80 | 5 | $C_0$ | 0.244, 0.417 pF |
| $T_1$ | 20 | 5 | $C_{load}$ | 2 pF |

TABLE 1-continued

Sizing of the 5-TFT Inverter of the results of FIG. 7

| TFT | W (µm) | L (µm) | parameter | value |
|---|---|---|---|---|
| $T_2$ | 120 | 5 | $V_{dd}$ | 12 V |
| $T_3$ | 20 | 20 | frequency | 1 khz |
| $T_4$ | 30 | 5 | | |

Figure 8:
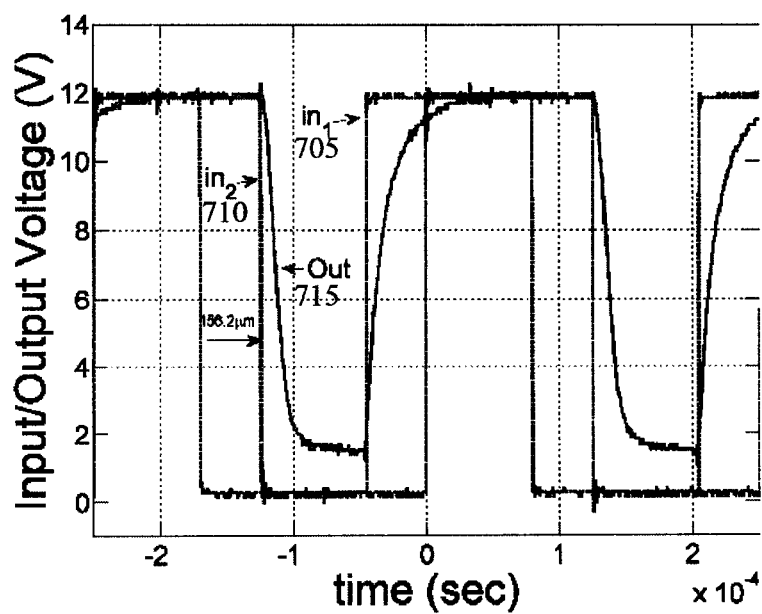
FIG. 8 illustrates measured responses of output of an embodiment of the a-Si:H 8-TFT OR logic gate of FIG. 3 and two input pulses of 2 kHz and delay of 156.2 µsec and $V_{dd}$=12V.

FIG. 8 shows the response of the output voltage (715) of the OR gate of FIG. 3, using TFTs of L=5 µm and for $C_0=0.731$ pF. The output voltage of the OR gate pulls up to $V_{dd}=12$V and pulls down to $V_{out_{LOW}}=\sim1.5$V, verifying the theory and simulations. When either of the inputs (in$_1$, (705), in$_2$ (710)) are high, the output of the OR gate goes high too. The experimental data are for a-Si:H TFTs and for two input pulses in$_1$ and in$_2$ of 2 kHz, a delay of 156.2 µsec, and a power supply of $V_{dd}=12$V. The $t_{rise}$ of the output voltage is 34 µs and $t_{delay}$ is 7.73 µs.

Power dissipation is generally an important parameter in electronics and in mobile applications in particular. For example, mobile displays are one of the main draws of power in mobile devices. As such, power dissipation is generally considered as a metric for evaluating circuit configurations. Therefore, the power dissipation of some proposed embodiments was calculated based on the simulations and is shown in TABLE II. The power dissipation of the 5-TFT design is increased 16% compared to the 2-TFT pseudo-N-type design. This is believed to be caused by the fact that $T_1$ and $T_4$ are conducting when input goes high creating a path from Vdd to ground. In order to switch off $T_1$ and $T_4$, an extra two TFTs can be added and a feedback loop may also be used as described further below.

Figure 9:
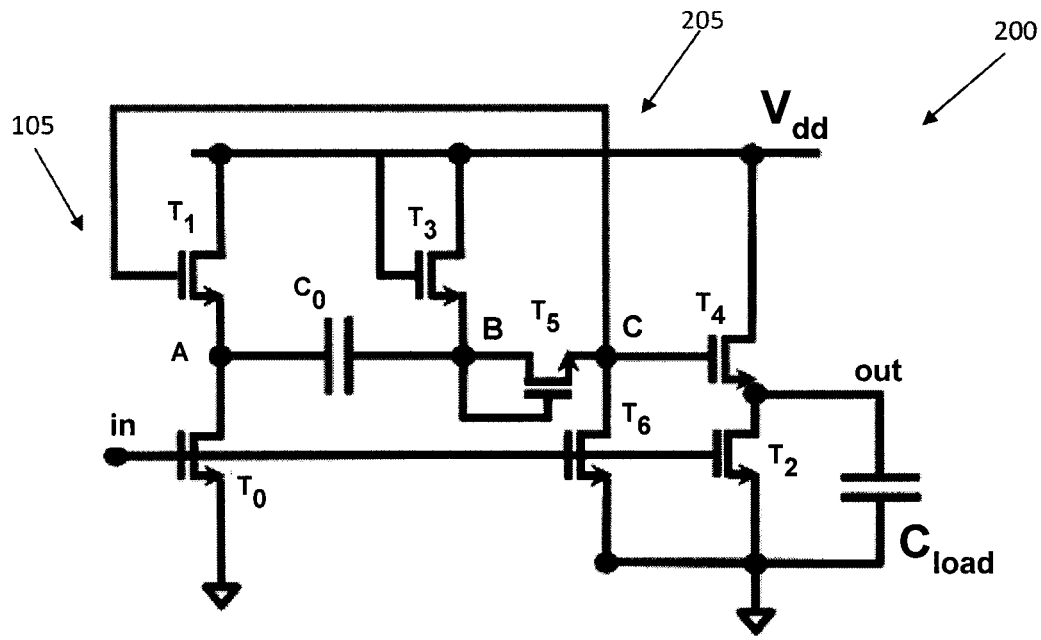
FIG. 9 illustrates an embodiment of a 7-TFT bootstrapping inverter with one input signal.

FIG. 9 shows another embodiment of an inverter circuit 200, sometimes referred to as a 7-TFT circuit. As shown in FIG. 9, two TFTs $T_5$ and $T_6$ are added to the circuit 100 of FIG. 2. In particular, $T_5$ and $T_6$ are connected in a second stage 205 of the inverter 200. $T_5$ is connected between the node B and a node C that is connected to the gate of transistor $T_4$. $T_6$ is connected between node C and ground with the gate of $T_6$ driven by the input signal (in). This configuration is provided in order to pull down (to approximately 0V) the gate voltage (node C) of the output pull up TFT $T_4$ when input is high. Further, a feedback loop is connected from node C back to the gate of $T_1$ and is used to turn off the input pull up transistor $T_1$ in order to reduce power dissipation.

As shown in FIG. 9, with the two added TFTs ($T_5$ and $T_6$), $T_6$ is used to pull down node C which drives the pull up $T_4$ and $T_1$ of the output node (out) and the input stage respectively. $T_5$ is used to isolate nodes B and C and create a voltage divider with $T_6$ biased at $V_B=V_{dd}-V_T$, when input is high. In order to achieve an optimized low voltage on node C such as $V_C \leq V_T$, when input is high, $T_5$ and $T_6$ are appropriately sized, decreasing substantially the conductivity of pull up $T_1$ and $T_4$, and as a result output goes low. When input goes low, node B pulls up due to the feedthrough from the capacitor $C_0$ and node A, to boost the gate voltage of output TFT $T_4$ and TFT $T_1$.

The capability of this embodiment was also simulated and its performance was analysed. TABLE II illustrates the results. In particular, a 7-TFT inverter circuit with added feedback resulted in a decrease in the power dissipation by up to 90% from a typical 2-TFT inverter (such as that in FIG. 1A) for a-Si:H (amorphous silicon) TFT technology. Similarly, a power dissipation reduction up to 60% is achieved using the InGaZnO IGZO technology. Comparison of the 7-TFT circuit to conventional designs, such as the circuit shown in FIG. 1A, has been shown to give an average of 30% lower overall power dissipation for a wide range of $V_{on}$ voltages and input data activities.

The $t_{rise}$ and $t_{delay}$ of the output voltage are now larger than for the 5-TFT design (FIG. 2) due to the initial lowest gate voltage on $T_1$ ($V_{G1} \leq V_T$) from the feedback loop from node C. $V_C$ is still larger than $V_{dd}+V_T$ because gate voltage $V_g$, $T_5=V_B$ of $T_5$ is larger than $V_{dd}+V_T$ driving $T_4$ and the output to $V_{dd}$. $t_{rise}$, $t_{delay}$, and fall time ($t_{fall}$) for all the inverter designs and a-Si:H TFTs are shown in TABLE II. With the addition of the two TFTs at internal node B, the total power dissipation (static+switching) ($P_{total}$) is decreased by 90.2% from that of the 2-TFT inverter (of FIG. 1A) and 91.4% from the 5-TFT design.

Figure 10:
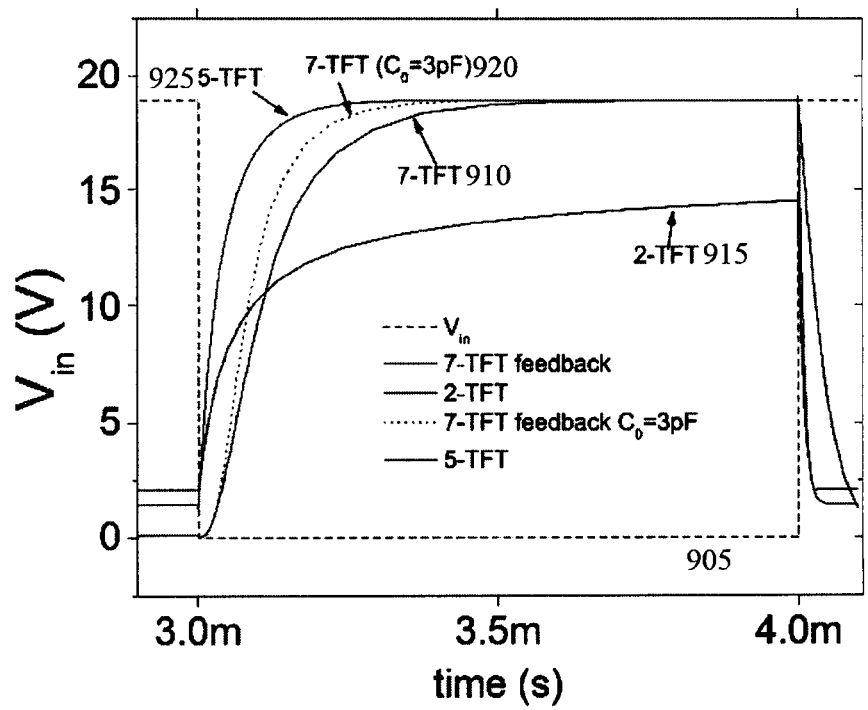
FIG. 10 illustrates simulated output responses ($V_{out}$) of the various inverter embodiments discussed using a-Si:H TFTs, a load of $C_{load}$=50 pF, an internal capacitor of $C_0$=1 pF, widths of the output transistor $W_4$=200 µm, $W_2$=50 µm and $V_{dd}$=19V.

FIG. 10 illustrates the voltage output response of the various inverter designs for a-Si:H TFT technology (input (905), 2-TFT (915), 5-TFT (925), 7TFT-feedback (910), 7TFT-larger $C_0$ (920)). The 7-TFT design not only pulls up to the highest $V_{dd}$ but also pulls down to the lowest voltage level (approximately 0V here), achieving an approximately rail-to-rail output swing and the lowest $P_{total}$, due to the reduction or minimization of the leakage and direct path currents. Consequently, the static power is decreased by 97.2% and 98% from the 2-TFT and 5-TFT designs, respectively The response times ($t_{rise}$ and $t_{delay}$) can be altered and generally improved by increasing the size of the internal capacitor $C_0$, as equation 1 suggests, without affecting the $P_{total}$ (1% increase). In FIG. 10, the voltage output response for a larger capacitor $C_0=3$ pF for the 7-TFT design is also shown and included in TABLE II. In this case, $t_{rise}$ is improved about 34% and $t_{delay}$ about 20% at the expense of 94% increase of the footprint, as shown in TABLE II.

The approximated footprint for the inverter designs is calculated by adding the channel area of the TFTs (W×L) and capacitors area and is shown in TABLE II. Interestingly, the footprint of the 7-TFT circuit is generally the same as the 5-TFT circuit. This is due to the fact that the output pull up $T_4$ is smaller than the output pull down $T_2$ in order to achieve low $V_{out-LOW}$ as dictated from eq. 1 in the 7-TFT circuit. In the 7-TFT circuit, node C is pulled low enough to bias the pull up $T_4$ lower than $V_T$, as analyzed above, and pull down to ground the output of the inverter.

Figure 11:
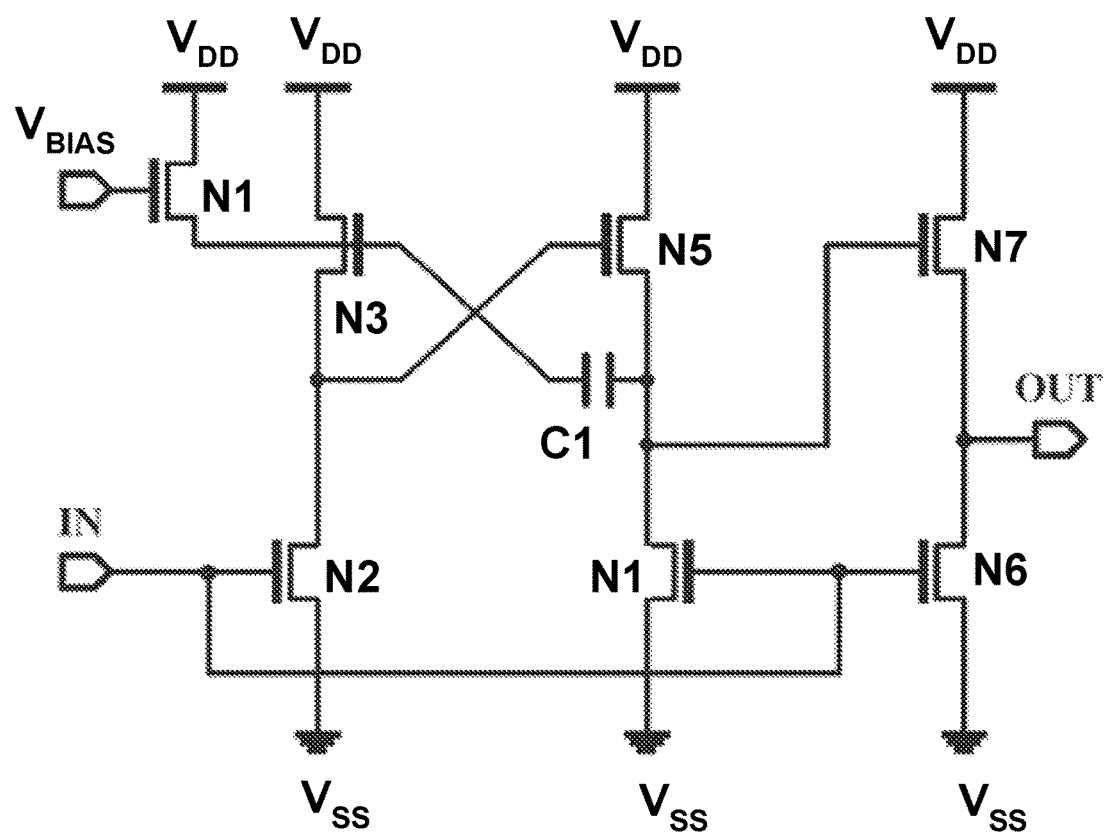
FIG. 11 illustrates a circuit design according to Hwang et al.

As noted above, IGZO TFT technology is rapidly developing and is proposed for the integration of driving electronics on the backplane of display and sensor arrays due to its higher mobility (>10×) compared to a-Si:H TFT technology and comparable electrical bias stability when compared to poly-Si TFT technology. Inverters and logic circuits have been introduced and proposed as a very basic circuit element for many digital designs. Typically, conventional designs in this technology use extra processing steps to implement inverters and improve their performance. For example, there is a proposed design that implements a cross-coupled inverter design (T. Hwang, I. Yang, O. Kwon, M. Ryu, B. Byun, C. Hwang, and S. K. Park, "Inverters Using Only N-Type Indium Gallium Zinc Oxide Thin Film Transistors for Flat Panel Display Applications", Japanese Journal of Applied Physics, vol. 50, pp. 03CB06, 2011, hereinafter "Hwang"). An example of the Hwang circuit is illustrated in FIG. 11. In the following, the performance of the proposed 7-TFT inverters using IGZO TFTs is analyzed and compared to this cross-coupled inverter design (sometimes referred to herein as the "Hwang design").

Figure 12:
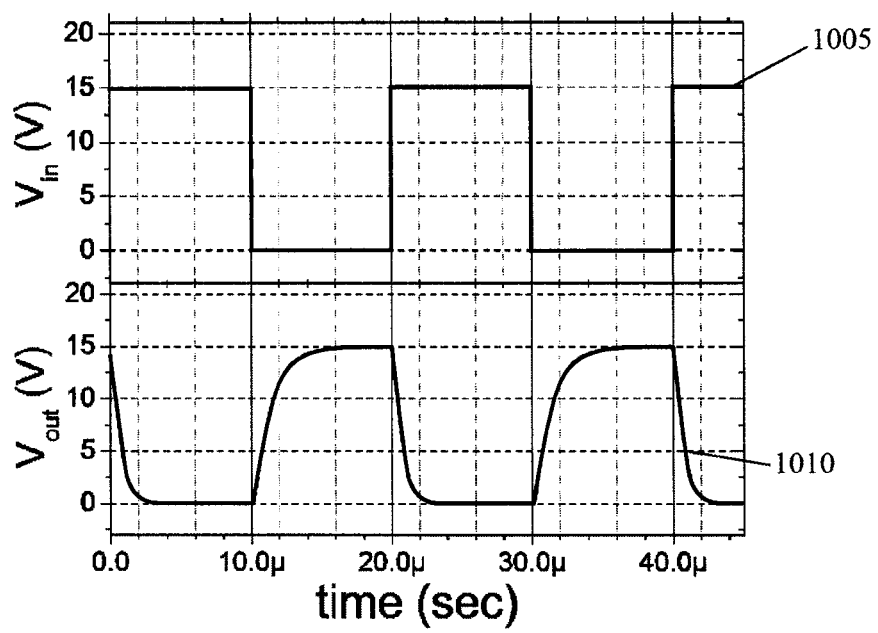
FIG. 12 illustrates the inverter of FIG. 9 for IGZO TFT technology and for $V_{on}$=−3V.

FIG. 12 shows the input (1005) and output (1010) voltage response of the 7-TFT inverter 200 using IGZO TFTs for $V_{on}=-3V$ and for an operation frequency of f=50 kHz, voltage supply of $V_{dd}=15V$ and an output load of $C_{load}=100$ pF. The sizing of the 7-TFT inverter 200 is shown in TABLE III, occupying a footprint of 2975 μm², which is 9.8% less than the cross-coupled design. As illustrated in FIG. 12, the simulated 7-TFT inverter circuit 200 is pulling up to $V_{dd}$ and pulling down to ground, even when using IGZO TFTs with negative $V_{on}$ voltage.

TABLE III

Sizing of the proposed 7-TFT inverter of FIG. 9 and IGZO TFTs model of FIG. 5

| TFT | W (μm) | L (μm) | parameter | value |
| --- | --- | --- | --- | --- |
| $T_0$ | 20 | 5 | C | 0.4 pF |
| $T_1$ | 20 | 5 | $C_{load}$ | 100 pF |
| $T_2$ | 50 | 5 | $V_{dd}$ | 15 V |
| $T_3$ | 100 | 5 | frequency | 50 khz |

TABLE II

Simulation Results of the total power dissipation ($P_{total}$), Rise Time ($t_{rise}$), and Fall Time ($t_{fall}$) from 10% to 90% of the output voltage response, the delay time from 50% of the input voltage to the 50% of the output voltage of the proposed inverters as a-Si:H TFTs.

| Inverters | $P_{total}$ (μW) | $t_{rise}$(μsec) | $t_{fall}$(μsec) | $t_{delay}$(μsec) | footprint(μm²) |
| --- | --- | --- | --- | --- | --- |
| 2-TFT (915) | 126.5 | — | — | 0.0723 | 1250 |
| 5-TFT (925) | 146.9 | 144 | 44 | 30.72 | 3800 |
| 7-TFT + feedback (910) | 12.66 | 250 | 94 | 103.1 | 3500 |
| 7-TFT + feedback - $C_0$ = 3 pF (920) | 12.79 | 160 | 94 | 81.86 | 6800 |

TABLE III-continued

Sizing of the proposed 7-TFT inverter of FIG. 9 and IGZO TFTs model of FIG. 5

| TFT | W (μm) | L (μm) | parameter | value |
| --- | --- | --- | --- | --- |
| $T_4$ | 50 | 5 | MIS-TFT* | 90 μm/5 μm |
| $T_5$ | 5 | 5 | | |
| $T_6$ | 10 | 5 | | |

(*only for 7-TFT with MIS-TFT)

Both the proposed 7-TFT circuit 200 and the Hwang design have seven TFTs, one capacitor and one pulsed input control line. However, the Hwang design uses cross coupled TFTs and an extra bias line ($V_{bias}$), adding complexity to the external driving circuits and generally more power dissipation in the total design. In the following, simulation results are obtained using the RPI a-Si:H model and the extracted parameters as demonstrated in FIG. 5. The non-uniformity of negative $V_{on}$ value is generally considered a critical parameter of IGZO TFTs. Therefore, the analysis presented herein is a function of the negative $V_{on}$ variation issue from process to process.

Figure 13:
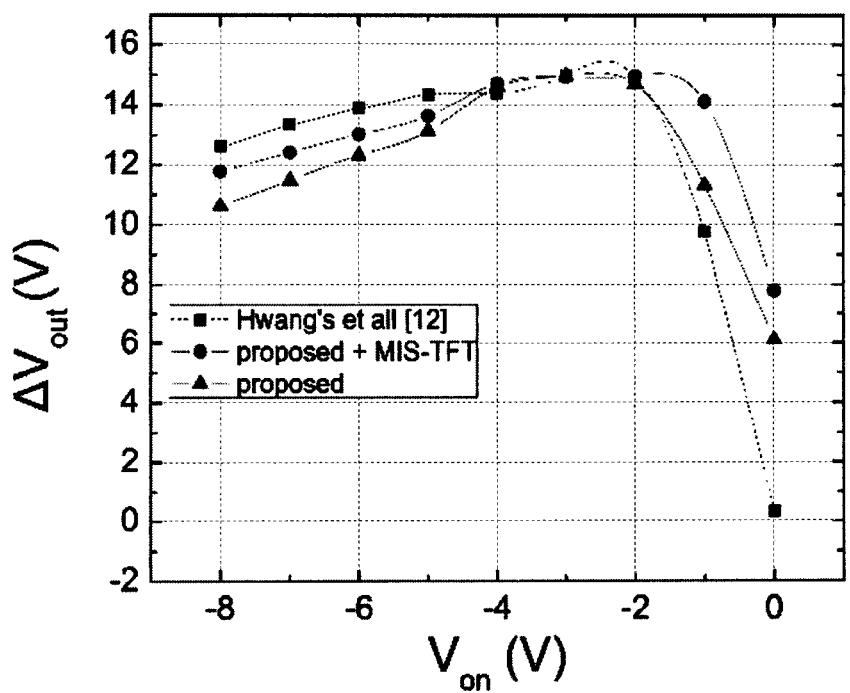
FIG. 13 illustrates the $\Delta V_{out}$ swing of the 7-TFT and 8-TFT inverters in comparison to a conventional inverter design for various $V_{on}$=0 to −8V.

FIG. 13 is a chart showing the $\Delta V_{out}$ swing for the proposed 7-TFT circuit 200 in comparison to the Hwang design for various $V_{on}$ voltages. The Hwang design achieves 8-14% better output swing for very low $V_{on}$=−8 to −5V than the proposed 7-TFT circuit 200. The proposed 7-TFT circuit 200 has equal to or better output swing for larger $V_{on}$=−4 to 0V.

Figure 14:
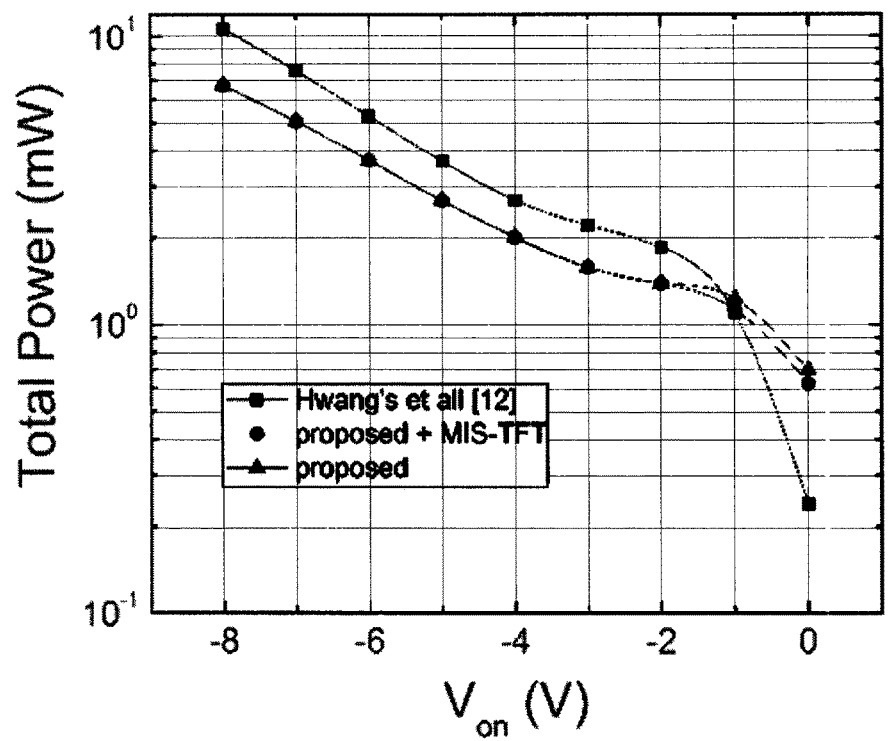
FIG. 14 illustrates the $P_{total}$ of the 7-TFT and 8-TFT inverters in comparison to a conventional inverter design for various $V_{on}$=0 to −8V.

Total power consumption $P_{total}$ is shown in FIG. 14 for the proposed 7-TFT circuit 200 in comparison to the Hwang design for various $V_{on}$ voltages. $P_{total}$ of the proposed 7-TFT circuit 200 is lower than the Hwang design for $V_{on}$=−2 to −8V achieving 25% to 36% lower $P_{total}$. While the Hwang design achieves lower power dissipation for higher $V_{on}$ voltages, for example, at $V_{on}$=0, we note that the Hwang design also generally needs more power due to the extra bias line, which has not been included in the calculations here.

Figure 15:
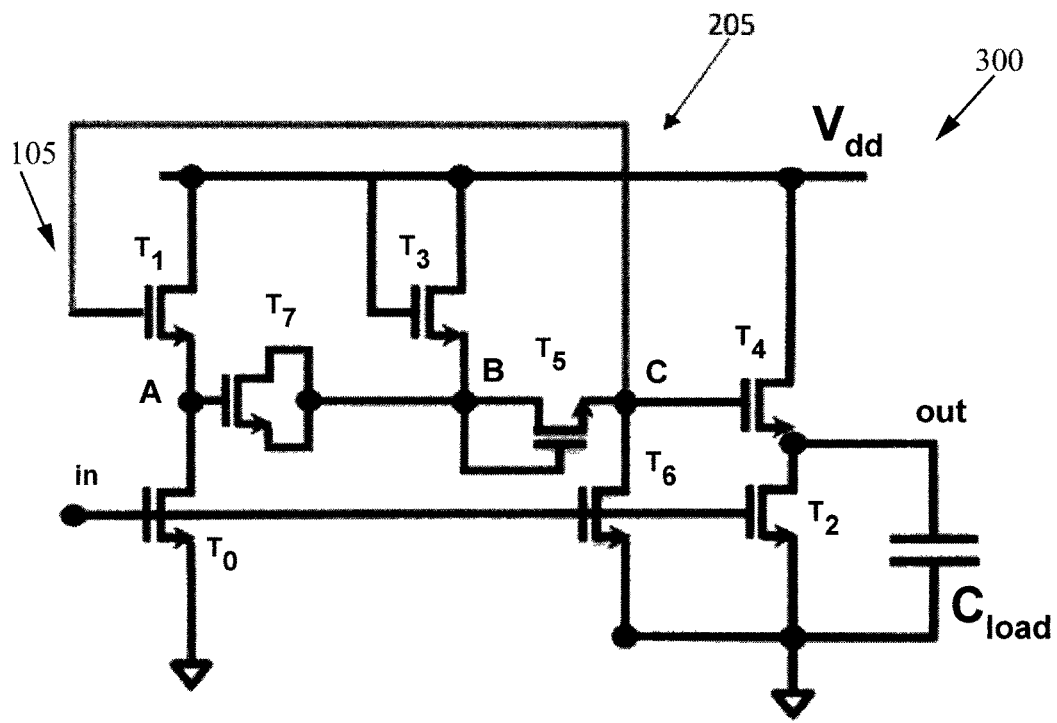
FIG. 15 illustrates an embodiment of an inverter circuit similar to that of FIG. 9 but in which the capacitor has been replaced by an MIS-TFT.

FIG. 15 shows an embodiment of an inverter circuit 300 in which the capacitor $C_0$ is replaced by a drain to source shorted MIS-TFT ($T_7$), (the inverter circuit 300 is sometimes referred to herein as the "8-TFT circuit"). In particular, the gate of $T_7$ is connected to node A, and the shorted source-drain is connected to node B. The MIS-TFT may be an a-Si:H-based TFT or could also involve other materials such as the transition metal oxides like InGaZnO-based TFTs, which may enable transparent circuits that have applications in heads-up displays and the like.

Figure 16:
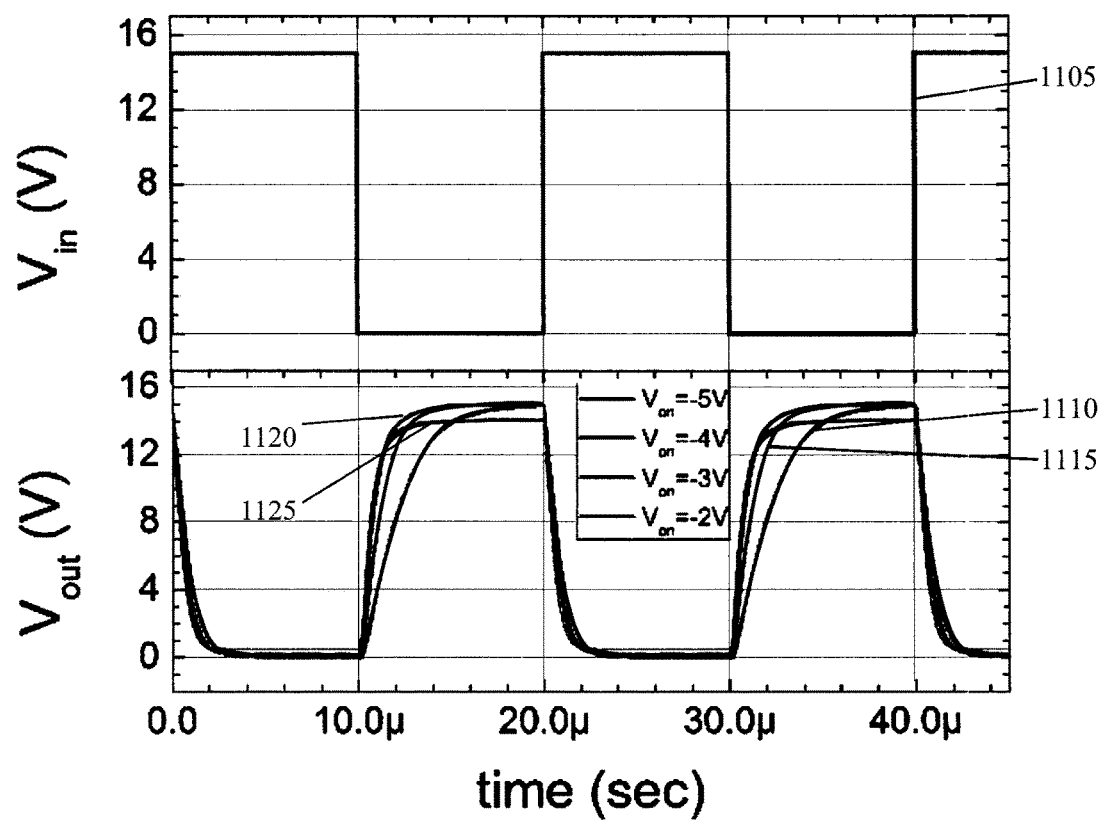
FIG. 16 illustrates the output of the IGZO TFT technology of FIG. 15 for various $V_{on}$ (=−5 to −2V) voltages.

FIG. 16 shows the output voltage response of the 8-TFT inverter 300. The simulations shown in FIG. 16 are for IGZO-TFTs for various $V_{on}$=−5 to −2V (1110, 1115, 1120, and 1125) and for an operation frequency of f=50 kHz, $V_{dd}$=15V, and a load of $C_{load}$=100 pF. The sizing of the TFTs of the inverter 300 occupy a footprint of about 3125 μm², 5.3% less than the cross-coupled design. FIGS. 13 and 14 show the $\Delta V_{out}$ swing and the $P_{total}$ for the proposed 8-TFT circuit 300 in comparison to the Hwang design for various $V_{on}$ voltages.

The use of the MIS-TFT instead of the capacitor $C_0$ is intended to improve the performance of the proposed 7-TFT circuit 200. The voltage output swing of the 8-TFT circuit 300 is improved up to 9.3% for the lowest $V_{on}$ voltages (−8 to −5V) and more than 25% for the highest $V_{on}$ voltages (−2 to 0V) compared to the 7-TFT circuit 200. The power dissipation of the 8-TFT circuit 300 is kept generally the same as the 7-TFT circuit 200 for $V_{on}$ from −8 to −2V (<0.5% lower) and drops more than 10% for the highest $V_{on}$ voltages. When compared to the Hwang design, the 8-TFT inverter circuit 300 has 4-6% worse $\Delta V_{out}$ for lower $V_{on}$, and equal to or better $\Delta V_{out}$ for higher $V_{on}$, as shown in FIG. 13.

The better results of the 8-TFT circuit 300 when compared to the 7-TFT circuit 200 is believed to be due to the use of what is essentially a variable capacitor (MIS-TFT). The charge stored at the MIS-TFT $T_7$ is changing with the changing $V_{on}$, since $V_T$ is changing accordingly:

$$Q_7 = C_i \cdot W_7 \cdot L_7 \cdot (V_B - V_A - V_T) + Q_{ov} \quad (3)$$

The various embodiments presented herein are intended to provide low power, small footprint and rail-to-rail logic gates using only one input control signal and power supply and five to eight TFTs. The embodiments were analyzed based on simulations for both a-Si:H TFT and IGZO-TFT technologies. Experimental results or simulations have shown an improved voltage swing of the various embodiments and the easy implementation to other logic gates, such as OR gate.

The power dissipation is reduced approximately 90% compared to the pseudo-N-type 2-TFT inverter circuit of FIG. 1A for a-Si:H TFTs and an average of about 25% from Hwang's design at the range of $V_{on}$=−8 to −2V. The $\Delta V_{out}$ swing deviated an average of 3.47% from rail-to-rail response for $V_{on}$=−5 to −1V for the IGZO TFT implementation of the 8-TFT inverter circuit 300.

As noted herein, inverter circuits are key elements in the implementation of logic and driving circuits on-panel for flat panel displays and sensor arrays. Increasing resolutions of mobile displays generally require increasing the number of bonding pads due to extra driving signals needed. It is intended that implementing logic on-panel will reduce or alleviate these needs as well as reduce the cost. Further, embodiments herein, such as the 7-TFT circuit 200, are intended to provide lower power dissipation for displays and may be used in, for example, mobile display applications or flexible display applications.

The technology described herein is intended to implement approximately rail-to-rail output swing with lower power dissipation and in general to use only one input and one power supply as an improvement when compared to conventional 2 TFT inverters. Generally speaking, the technology achieves low power dissipation using a feedback loop to drive the input pull-up transistor to cut down the direct path current when the input is high; and capacitive coupling to boost the input voltage of the output stage pull-up transistor when input goes low to realize an approximately full swing inverter. In some embodiments, two additional transistors are used to control and achieve low voltage on a critical intermediate node, for example node C, to significantly reduce the direct path current (and thus, power dissipation) when input goes high.

In some embodiments, a feedback loop can also be used to correct the output swing and minimize the off leakage and power dissipation. In particular embodiments, an extra three to five TFTs are used, which are intended to improve the power dissipation and output swing at the relatively small cost of area and complexity. The simulations described herein are based on experimental characterization and modeling of a-Si:H TFTs and IGZO TFTs.

It is intended that the embodiments of TFT circuits, systems and methods described herein be compatible with standard industrial technology. No complex fabrication processes are intended to be used to implement complementary technology. One area which might benefit from the embodiments herein may be for external driving circuitry for mobile/flexible and high resolution, large area flat panel displays and sensors arrays. Further, embodiments herein, such as the 7-TFT circuit 200, may improve signal processing on flat panel displays (flexible or glass).

Further, it is intended that the embodiments herein reduce costs since TFT technology is much cheaper than CMOS technology and generally needs fewer contact pads and wire bondings. The embodiments herein may be integrated on the panel (glass or plastic) reducing the overall size of the product and the mechanical efficiency due to fewer off-panel connections. Wire bond is a mechanical metal bond which generally requires extreme precision and costs. By reducing the need for wire bonding, the overall manufacture cost may be lower due to the implementation of more electronics using the same TFT technology. Lower cost may also be realized by the end user due to the lower power dissipation, due to the lower parasitics of the lines on the drivers.

In the preceding description, for purposes of explanation, numerous details are set forth in order to provide a thorough understanding of the embodiments. However, it will be apparent to one skilled in the art that some specific details may not be required. In other instances, well-known structures and circuits may be shown in block diagram form in order not to obscure the understanding. For example, specific details are not provided as to whether some aspects of the embodiments described herein are implemented as a software routine, hardware circuit, firmware, or a combination thereof.

In some cases, embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

The invention claimed is:

1. A unipolar inverter circuit for thin-film transistor circuits comprising:
   a driving voltage input;
   an input signal input;
   a base voltage input;
   a first stage comprising a first unipolar inverter circuit connected between the driving voltage input and the base voltage input and driven by an input signal received by the input signal input;
   a capacitor coupled to the output of the first stage at a node A; and
   a second stage comprising:
      a second unipolar inverter circuit connected between the driving voltage input and the base voltage input, wherein the second unipolar inverter circuit comprises a second stage load transistor and a second stage driving transistor, wherein a gate of the second stage load transistor is connected to the capacitor at a node B rather than to the driving voltage input; and
      a clamping transistor connected between the driving voltage and the node B for controlling a voltage across the capacitor, wherein the clamping transistor gate is connected to the driving voltage; and
      an output provided between the second stage load transistor and the second stage driving transistor,
   wherein the capacitor enables charge injection to the gate of the second stage load transistor to allow at least 90% of full voltage swing of the output voltage at the output based on the input signal.

2. An inverter circuit according to claim 1, wherein:
   the first stage comprises:
      a first stage driving transistor connected to the base voltage input; and
      a first stage load transistor connected to the first stage driving transistor and the driving voltage input,
   wherein the first stage driving transistor gate is connected to the input signal input and the first stage load transistor gate is connected to the driving voltage input and the capacitor is connected to the node A between the first stage driving transistor and the first stage load transistor.

3. An inverter circuit according to claim 1, further comprising a switchable feedback unit configured to pull down a gate voltage of the first stage load transistor and the second stage load transistor when the input signal input is low.

4. An inverter circuit according to claim 3, wherein the switchable feedback unit comprises:
   a first feedback transistor provided with a source and gate connected to the node B connecting the capacitor and the second stage load transistor and a drain connected to a node C connected to the gate of the second stage load transistor; and
   a second feedback transistor provided with a source connected to the node C, a gate connected to the input signal input and a drain connected to the base voltage input.

5. An inverter circuit according to claim 4, wherein a gate of the first stage load transistor is connected to the node C instead of the driving voltage input.

6. An inverter circuit according to claim 1, wherein the driving voltage input is the only voltage input.

7. An inverter circuit according to claim 1, wherein the input signal input is the only input signal input.

8. An inverter circuit according to claim 1, wherein the second stage load transistor, the second stage driving transistor, and the clamping transistor are a-Si:H thin-film transistors.

9. An inverter circuit according to claim 1, wherein the second stage load transistor, the second stage driving transistor, and the clamping transistor are transition-metal oxide transistors.

10. An inverter circuit according to claim 7, wherein the second stage load transistor, the second stage driving transistor, and the clamping transistor are InGaZnO transistors.

11. A logic gate comprising the unipolar inverter circuit of claim 1.

12. An electronic circuit comprising the unipolar inverter circuit of claim 1.

13. A TFT display comprising the unipolar inverter circuit of claim 1.

14. A unipolar TFT inverter system comprising:
   a unipolar two transistor inverter connected between a driving voltage and a base voltage;
   means for boosting an output voltage of the inverter when an input signal is low, wherein the means for boosting does not require an additional voltage input; and
   means for reducing a gate voltage of a load transistor of the inverter when the input signal is high.

15. A unipolar TFT inverter system according to claim 14, further comprising feedback means for reducing power consumption when the input signal is high.

16. A unipolar TFT inverter system according to claim 14, wherein the means for boosting does not require cross-connecting of transistors.

17. A unipolar TFT inverter system according to claim 14, wherein the means for boosting comprises boosting a gate voltage at a load transistor of the unipolar two transistor inverter.

18. A method of controlling a unipolar TFT inverter circuit, the method comprising:
- boosting an output voltage of the unipolar TFT inverter circuit when an input signal of the unipolar TFT inverter circuit is low, via a capacitor providing charge injection to a gate of a load transistor of the unipolar TFT inverter circuit; and
- reducing the gate voltage of the load transistor of the unipolar TFT inverter circuit when the input signal of the unipolar TFT inverter circuit is high, via a switchable feedback unit configured to pull down a gate voltage of the first stage load transistor and the second stage load transistor when the input signal input is low.

19. A method according to claim 18, further comprising feedback of a voltage for reducing power consumption when the input signal is high.

20. A method according to claim 18, wherein the boosting does not require an additional voltage input.

* * * * *